March 19, 1957 J. L. GOETZ 2,786,141

BALANCED TUNER

Filed April 20, 1953

INVENTOR.

JOHN L. GOETZ

BY Marvin Moody

ATTORNEY

United States Patent Office 2,786,141

Patented Mar. 19, 1957

2,786,141

BALANCED TUNER

John L. Goetz, Cedar Rapids, Iowa, assignor to Collins Radio Company, Cedar Rapids, Iowa, a corporation of Iowa Application April 20, 1953, Serial No. 349,630

4 Claims. (Cl. 250—40)

Figures 1, 2:
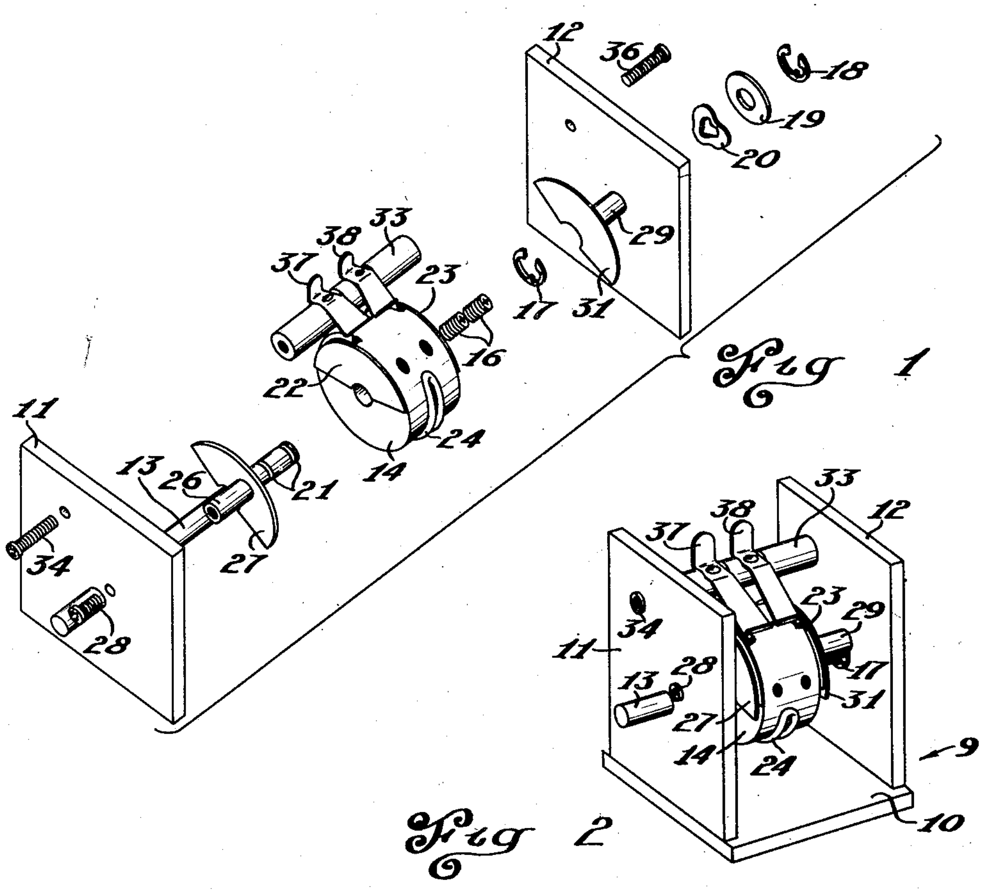

This invention relates generally to balanced tuners which operate at the higher frequencies of the radio frequency spectrum, and in particular to small sturdy balanced tuners capable of maintaining linearity between shaft rotation and resonant frequency.

The terminals of a tuner are usually connected to some form of capacitance. Any capacitance connected in parallel with internal tuner capacitance affects the tuner's resonant frequency and lowers its high frequency range. It is therefore desirable to minimize the effect of external capacitance upon a tuner.

A balanced tuner consists of a parallel resonant circuit with a grounded center point which provides two terminals with opposite phase voltages. An input circuit is connected between one voltage terminal and ground, and an output circuit is connected between the other voltage terminal and ground. The balanced tuner places the capacitance of the input circuit in series with the capacitance of the output circuit. On the other hand, an unbalanced tuner places the capacitance of the input circuit in parallel with the capacitance of an output circuit. Therefore, equal input and output capacitances connected to a balanced tuner have one-fourth the combined capacitance that they would have if connected to an unbalanced tuner. This is true because two equal capacitors connected in series have one-fourth the capacitance of the same capacitors connected in parallel. The balanced tuner therefore reduces the effect of external capacitance upon the tuner. It is therefore an object of this invention to provide a small, sturdy and easily constructed balanced tuner.

Balanced tuners are particularly advantageous when used as filters between cascaded grounded-grid circuits. Grounded-grid circuits cascaded by ordinary coupling methods provide in phase plate voltages which result in regenerative feedback. It has been found that regenerative feedback is avoided when alternate stages have opposite phased plate voltages. Therefore a balanced tuner which is used as the coupling means between adjacent grounded-grid circuits provides opposite phased plate voltages, and regenerative feedback is prevented. It is therefore another object of this invention to provide a coupling filter which will reverse the phase between plate voltages of adjacent cascaded grounded-grid circuits.

It is often desired to maintain a predetermined relationship between tuner frequency and tuner shaft rotation. It is another object of this invention to provide a balanced tuner wherein any desired predetermined relationship between tuner resonant frequency and shaft rotation may be obtained. Since a linear relationship is most often desired, the embodiment described has this feature.

It is oftentimes desirable to have a continuously rotatable tuner. It is another object of this invention to provide a tuner which has a control shaft that may be continuously rotated in one direction.

Since a tuner is often a termination for a transmission line, it is necessary that the tuner's impedance match the characteristic impedance of the line. It is also necessary to maintain this match as the tuner's resonant frequency is varied. It is therefore yet another object of this invention to provide a tuner which has a predetermined impedance versus frequency relationship.

The invention consists of a cylindrical drum of insulating material fixed on a rotatable shaft. An open-end wire inductance loop is wrapped around the periphery of the drum and the respective loop ends are connected to capacitor plates which are mounted on opposite ends of the drum. Stationary capacitor plates are mounted closely to each drum capacitor plate. An input flexible contact rides on one side of the inductance loop, and an output flexible contact rides on the other side of the inductance loop.

Figure 3:
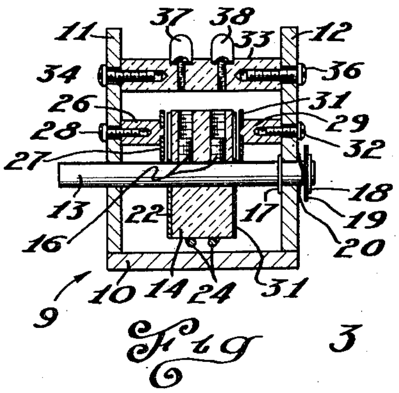
Figure 4:
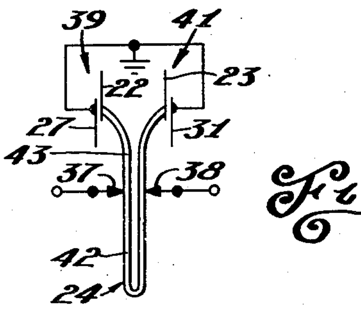

Other objects, advantages and features will be apparent upon a further study of the specifications and drawings, in which:

Figure 1 is an exploded view of the invention;
Figure 2 is a perspective view of this invention;
Figure 3 is a sectional view of this invention; and
Figure 4 is a schematic diagram of this invention.

Now referring to the invention in more detail, Figure 2 shows a frame 9 which consists of a frame plate 10 and upright frame ends 11 and 12. A shaft 13 is rotatably supported by frame ends 11 and 12, and an insulating cylindrical drum 14 is mounted on shaft 13 by set screws 16. Drum 14 may be made of polystyrene or other suitable material.

Lock rings 17 and 18 fit in a pair of grooves 21, respectively, in shaft 13 on opposite sides of frame end 12 to limit longitudinal motion. A washer 19 and spring spacer 20 are mounted on shaft 13 between lock ring 18 and frame end 12 to prevent longitudinal play between shaft 13 and frame 9.

A first semi-circular condenser plate 22 is fastened to one end of drum 14, and a second semi-circular condenser plate 23 is fastened in identical manner to the opposite end of drum 14. An open-ended conductive inductance loop 24 is wrapped about the periphery of drum 14, and its ends are connected to the plates 22 and 23, respectively.

A fixed semi-circular condenser plate 27 is spaced parallel to drum plate 22 and is fastened to a stand-off 26 which is fixed to frame end 11 by fastening means 28. Plates 22 and 27 form the capacitor 39 shown in Figure 4.

In like manner another fixed semi-circular condenser plate 31 is mounted parallel to drum plate 23 and is fastened to a stand-off 29 that is fixed to frame end 12 by fastening means 32. Plates 23 and 31 form a capacitor 41 which is in series with capacitor 39 since fixed plates 27 and 31 are connected through grounded frame 9, as shown in Figure 4.

An insulating support rod 33 is fixed between frame ends 11 and 12 by fastening means 34 and 36. A first flexible contact 37 is fastened to support rod 33 and slidably engages one side of inductance loop 24. Likewise, a second flexible contact 38 is fastened to support rod 33 and slidably engages the other side of inductance loop 24.

The tuner is shown schematically in Figure 4. The contacts 37 and 38 determine the equal and opposite branch impedances in the tuner's parallel resonant circuit. Contacts 37 and 38 electrically divide loop 24 into a portion 42, which forms the inductive branch of the parallel resonant circuit, and into a portion 43 in series with capacitors 39 and 41, which form the capacitive branch of the parallel resonant circuit.

Portion 42 is in effect a two conductor transmission line short circuited at one end. Its inductance is controlled by varying conductor length and conductor spacing. Since the length of portion 42 is a function of shaft rotation, a predetermined relationship is obtained between shaft rotation and the inductance by adjusting the conductor spacing. It has been found that a linear relation between frequency and shaft rotation can be obtained, when semi-circular condenser plates are used, by providing an exponential increase in loop spacing from its short circuited end.

When shaft 13 is rotated clockwise in Figure 2, which is equivalent to upward movement of members 22, 23 and 24 in Figure 4, the inductive reactance of portion 42 decreases as it is shortened. The capacitive reactance of capacitors 39 and 41 increases as they open while the inductive reactance of portion 43 increases. This helps to control the effective capacitive reactance of capacitors 39 and 41. The controlled variation of the effective capacitance of one branch to the effective inductance of the other branch maintains a constant ratio as frequency changes. This provides constant tuner impedance and maintains a linear frequency change with shaft rotation. The resonant frequency then increases as shaft 13 is rotated clockwise.

When shaft 13 is rotated counterclockwise, the components vary in an opposite manner and the resonant frequency decreases.

The frequency range of this embodiment is traversed in 180 degrees of shaft rotation because of the semi-circular geometry of the capacitor plates. The loop 24 extends around the periphery of drum 14 by B degrees which is greater than 180 degrees but less than 360 degrees. It has been found that 270 degrees is a satisfactory value for B. The cycle of 180 degrees active rotation and 180 degrees inactive rotation will be repeated once for every revolution of shaft 13 regardless of which direction of rotation occurs.

While a preferred embodiment of this invention has been shown and described, it is to be understood that numerous variations and modifications may be made by anyone skilled in the art without departing from the true spirit and scope of the disclosure, as defined by the appended claims.

1. A tuner comprising, a frame, a shaft rotatably supported by said frame, a drum of insulating material axially fixed on said shaft, a first semi-circular condenser plate attached to one end of said drum, a second semi-circular condenser plate attached to the other end of said drum, a loop of wire wrapped about the circular periphery of said drum said wire loop formed open at one end and closed at its other end, the adjacent sides of said loop formed with a spacing that exponentially changes with distance from its open end, the open ends connected respectively to said first and second drum condenser plates, a third semi-circular condenser plate mounted to said frame parallel and adjacent to said first plate, a fourth condenser plate mounted to said frame parallel and adjacent to said second plate, an input contact insulatingly supported from said frame and slideably and electrically engageable with one side of said loop, and an output contact insulatingly supported from said frame slideably and electrically engageable with the opposite side of said loop.

2. A balanced tuner comprising, a frame with a pair of upright frame ends, a shaft rotatably supported through said frame ends, a cylindrical drum of insulating material axially fixed on said shaft, a pair of drum condenser plates fastened to opposite ends of said drum, an open-end inductance loop formed of wire mounted about the circular periphery of said drum, the ends of said loop connected to said drum condenser plates respectively, said loop closed at its end opposite said open-end, the adjacent sides of said loop variably spaced with the spacing varying exponentially from the short-circuited end to the open-circuited end, a pair of fixed condenser plates supported from said frame with each fixed plate adjacent and parallel to one of said drum condenser plates, a pair of flexible contacts insulatingly supported from said frame and from each other with each slideably and electrically engaging the outer surface of an opposite side of said loop.

3. A balanced tuner comprising, a frame with a pair of upright frame ends, a shaft rotatably supported by said frame ends, a drum of insulating material axially fixed on said shaft, a first condenser plate formed semi-circularly and fixed to one end of said drum, a second condenser plate formed semi-circularly and fixed to the other end of said drum, a first stand-off of insulating material fixed to one frame end, a third condenser plate formed semi-circularly and fastened to said first stand-off and supported parallel and adjacent to said first condenser plate, a second stand-off of insulating material fixed to the opposite frame end, a fourth condenser plate formed semi-circularly and fastened to said second stand-off and supported parallel and adjacent to said second condenser plate, an open-end inductance loop of conducting material fixed about the circular periphery of said drum over a range of from 180 to 360 degrees and with its open-end connected respectively on each side to said first and second condenser plates, said loop formed with a variable axial spacing that varies exponentially from the open end over a range of less than the total length of said loop, an insulator support rod fastened between said frame ends, a first flexible contact fastened to said support rod and slideably contacting one side of said loop, and a second flexible contact fastened to said support rod and slideably contacting the other side of said loop.

4. A tuner comprising, a frame, a shaft rotatably supported by said frame, a drum of insulating material supported on said shaft, a generally hairpin-shaped inductance loop attached to the periphery of said drum and generally wrapped about it over a range of greater than 180 degrees and less than 360 degrees, said loop comprising opposite sides that are variably spaced in an exponential manner from the open end over a range of at least 180 degrees, an insulating support supported by said frame, a pair of slide contacts mounted on said insulating support and engageable with the outer side of opposite sides of said inductance loop, a pair of semi-circular drum condenser plates attached to opposite sides of said insulating drum transversely of said shaft and connected to opposite ends of said inductance loop, a pair of semi-circular fixed condenser plates supported from said frame member adjacent and parallel to said drum condenser plates, and said fixed condenser plates connected to ground.

References Cited in the file of this patent

UNITED STATES PATENTS

| | | |
|---|---|---|
| 2,126,541 | De Forest | Aug. 9, 1938 |
| 2,483,893 | Everitt | Oct. 4, 1949 |
| 2,540,137 | Page | Feb. 6, 1951 |
| 2,573,045 | Murphy et al. | Oct. 30, 1951 |

FOREIGN PATENTS

| | | |
|---|---|---|
| 681,175 | Great Britain | Oct. 22, 1952 |